United States Defensive Publication [19] (H) [11] T954,002

Castrucci et al. [43] Jan. 4, 1977

[54] PROCESS FOR INCREASING MASK LIFE

[75] Inventors: Paul P. Castrucci; Robert H. Collins, both of Poughkeepsie; Frank T. Deverse, Wappingers Falls, all of N.Y.

[73] Assignee: International Business Machines Corporation, Armonk, N.Y.

[21] Appl. No.: 659,177

[22] Filed: Feb. 17, 1976

Related U.S. Application Data

[63] Continuation of Ser. No. 436,320, Jan. 24, 1974, abandoned, which is a continuation of Ser. No. 195,876, Nov. 4, 1971, abandoned, which is a continuation of Ser. No. 699,268, Jan. 19, 1968, abandoned.

[51] Int. Cl.$^2$ ..... G03C 5/00

[52] U.S. Cl. ..... 96/38.3; 96/36; 96/36.2

[57] ABSTRACT

A method for semiconductor device manufacture comprising the steps of, (a) repetitively aligning photomasks over a surface of a semiconductor substrate, said substrate having a layer of opaque material on said surface, said opaque material being adapted to receive and retain a photographic pattern; and (b) at least one of said steps employing a photomask of a particular construction, said particularly constructed photomask being placed in physical contact with said opaque material, said particularly constructed photomask essentially consisting of a planar glass substrate having a thickness of approximately 0.25 inches, one surface of said glass substrate having a thin film of chrome thereon, said thin film of chrome having a thickness of approximately 0.1 microns, said thin film of chrome having a photographic pattern formed therein, a layer of $SiO_2$ fully covering said thin film of chrome and said surface of said glass substrate, said $SiO_2$ layer having a thickness of approximately 3,000 angstroms, whereby the useful life of said particularly constructed photomask is materially extended and said method for semiconductor device manufacture is rendered less costly and more efficient.

1 Claim, 1 Sheet Drawing, 16 Pages Specification

The file of this unexamined application may be inspected and copies thereof may be purchased (849 O.G. 1221, Apr. 9, 1968).

FIG. 1A
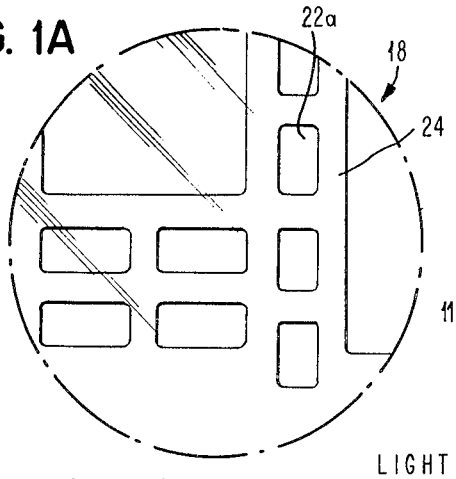
FIG. 2
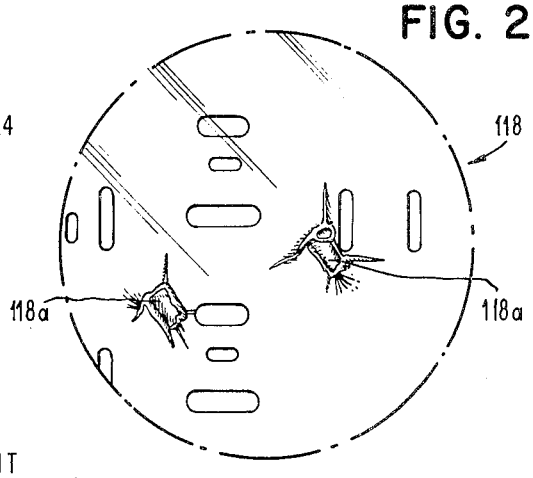
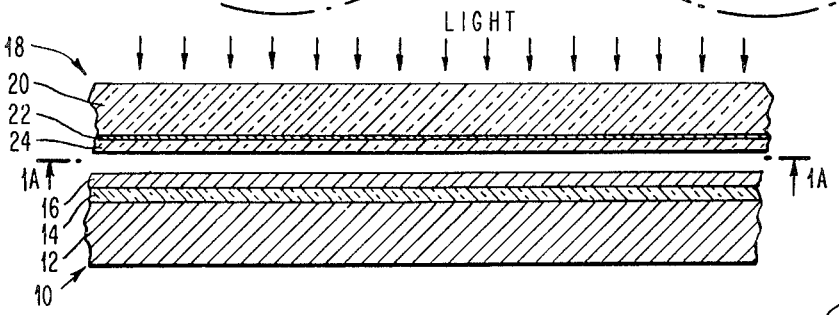
FIG. 1B
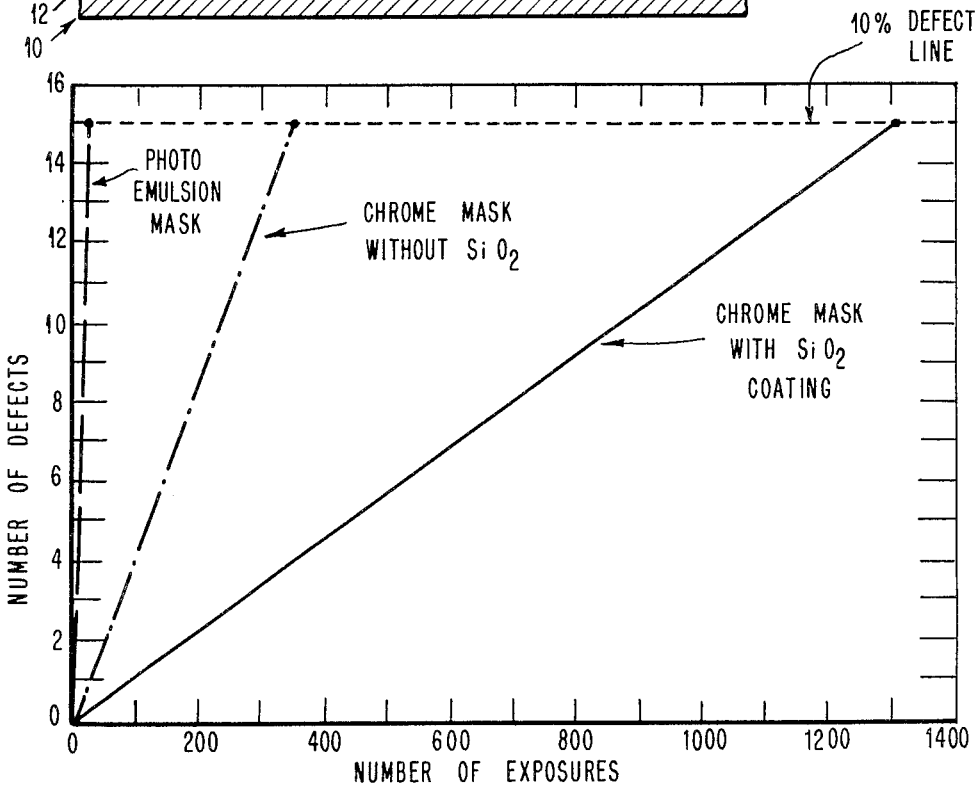
FIG. 3